United States Patent
Miyagi

(10) Patent No.: US 6,930,552 B2
(45) Date of Patent: Aug. 16, 2005

(54) FET BAND AMPLIFIER

(75) Inventor: Hiroshi Miyagi, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 66 days.

(21) Appl. No.: 10/467,499

(22) PCT Filed: Feb. 21, 2002

(86) PCT No.: PCT/JP02/01540

§ 371 (c)(1), (2), (4) Date: Aug. 7, 2003

(87) PCT Pub. No.: WO02/067415

PCT Pub. Date: Aug. 29, 2002

(65) Prior Publication Data

US 2004/0070447 A1 Apr. 15, 2004

(30) Foreign Application Priority Data

Feb. 22, 2001 (JP) .................................. 2001-047324

(51) Int. Cl.$^7$ ............................. H03F 3/16; H03F 3/45; H03G 3/20
(52) U.S. Cl. ........................ 330/277; 330/133; 330/254
(58) Field of Search ............................... 330/133, 254, 330/260, 277, 285, 292, 294, 306, 307, 311

(56) References Cited

U.S. PATENT DOCUMENTS

| | | | | |
|---|---|---|---|---|
| 5,777,516 A | * | 7/1998 | Koifman et al. | ............. 330/277 |
| 6,518,843 B1 | * | 2/2003 | Fujita | ........................ 330/284 |

FOREIGN PATENT DOCUMENTS

| | | |
|---|---|---|
| JP | 63-46008 | 2/1988 |
| JP | 1-137710 | 5/1989 |
| JP | 4-306922 | 10/1992 |
| JP | 7-283659 | 10/1995 |
| JP | 8-335831 | 12/1996 |

* cited by examiner

*Primary Examiner*—Steven J. Mottola
(74) *Attorney, Agent, or Firm*—Dellett & Walters

(57) ABSTRACT

An FET band amplifier for reducing a residual noise during gain control. An FET band amplifier 5 included in an AM receiver comprises amplifiers 11 to 15 e.g. at five stages, a BPF 16 inserted halfway in their connection, and an AGC circuit 8. The BPF 16 allows the passage of a component of a band wider than the amplification band of the whole of the FET band amplifier and reduces a 1/f noise by removing a low-band component of a signal output from the amplifier 13 at the third stage and thermal noise by removing the high-band component. This process enables a reduction in a residual noise during gain control included in a signal output from the amplifier 15 at the final stage.

30 Claims, 14 Drawing Sheets

FET BAND AMPLIFIER

BACKGROUND OF THE INVENTION

1. Field of the Invention

The present invention relates to an FET band amplifier used in various receivers and so on.

2. Description of the Related Art

Band amplifiers that amplify signals of a predetermined band are used in various kinds of receivers such as an AM receiver and an FM receiver. Typical band amplifiers include an intermediate frequency amplifier that amplifies intermediate frequency signals. In the intermediate frequency amplifier, only signals of a narrow band close to the intermediate frequency are selectively amplified. The center frequency in this case is set to a fixed value such that for example, the center frequency is 10.7 MHz in the case of the FM receiver, and the center frequency is 455 kHz in the case of the AM receiver. Furthermore, generally, an automatic gain control circuit is connected to the intermediate frequency amplifier for setting an optimum gain according to the level of electric field strength. For example, in the AM receiver, there is provided an automatic gain control circuit that controls the gain of the intermediate frequency amplifier to be kept at an appropriate value according to the output level of an AM detection circuit.

A multistage amplifier with transistors connected in multiple stages is generally used for obtaining a predetermined gain in the band amplifier. At this time, if a noise occurring in the transistor of each stage is large, the noise component is amplified and accumulated in the transistor of each stage, and therefore the noise component included in a signal outputted from the transistor of the final stage is increased. If the noise component occurring in the band amplifier itself is increased in this way, a problem arises such that a residual noise is increased when the electric field strength is high and the gain of the band amplifier is controlled to be kept at a small value. Especially, if the band amplifier is formed using a CMOS process, a MOS-type FET is used as an amplification element. Generally, the MOS-type FET has a large amount of 1/f noise appearing in a low-frequency range compared to the bipolar transistor, and therefore requires some countermeasures.

SUMMARY OF THE INVENTION

The present invention has been created in consideration of the above-described points, and an object of the present invention is to provide an FET band amplifier capable of reducing a residual noise during gain control.

For solving the problems described above, the FET band amplifier of the present invention has a multistage amplifier and a gain control circuit that controls the gain of the multistage amplifier. The multistage amplifier comprises amplifiers of multiple stages cascaded in which FETs are used as amplification elements, and a band-pass filter inserted in mid-stage of amplifiers of multiple stages and adjusted to have a passing band wider than an amplification band. Furthermore, p channel FETs are used as FETs of at least first to nth-stage amplifiers. It is possible, by using the band-pass filter having a passing band wider than the amplification band, to eliminate 1/f noise existing on a lower-frequency side than the passing band and thermal noise existing on a higher-frequency side than that. Furthermore, by using as an amplification element the p channel FET having a small mobility, the noise occurring in the amplifier can be further reduced. Thus, by removing a noise occurring in each amplifier of the fore-stage part by the band-pass filter, and reducing the occurring noise itself by using the p channel FET as an amplification element, a residual noise included in a signal outputted from the final-stage amplifier during gain control can be considerably reduced. Furthermore, by using an FET as an amplification element, the entire FET band amplifier can be fabricated on a semiconductor substrate in a process for producing FETs, thus making it possible to make an integration process easier and achieve a reduction of costs and savings in space, compared to the case where a bipolar transistor is used as an amplification element.

Furthermore, the FET band amplifier of the present invention comprises a multistage amplifier including amplifiers of multiple stages cascaded in which FETs are used as amplification elements, and a gain control circuit that controls a gain of the multistage amplifier. The amplifier of each stage has a high-band component elimination unit for eliminating components of bands higher than the upper limit of amplification band components from input/output signals and a low-band component elimination unit for eliminating components of bands lower than the lower limit of the amplification band components from input/output signals. P channel FETs are used as FETs of at least first to nth-stage amplifiers. In the amplifier of each stage, accumulation of noise components is prevented because components other than those of the amplification band are removed, and a noise occurring in the amplifier can be further reduced by using as an amplification element a p channel FET having a small mobility, thus making it possible to further reduce a residual noise included in a signal outputted from the final-stage amplifier.

In particular, it is desirable that the above-mentioned low-frequency component elimination unit be a high-pass filter in which a cutoff frequency is set at a value lower than the amplification band. It is possible, by providing the high-pass filter on the amplifier in each stage, to easily eliminate the 1/f noise lower than the cutoff frequency of the high-pass filter.

In addition, it is desirable that the above-mentioned amplifier be the differential amplifier for differentially operating two FETs, and the low-frequency component elimination unit be a feedback circuit for inputting the signal in which low-frequency components of differential output signals of the amplifier in each stage are synthesized in phase to the two FETs. It is possible, by synthesizing only the low-frequency components included in the differential output signals of the differential amplifiers and feeding them back in phase to an input side, to stop differential operation of the differential amplifiers corresponding to the low-frequency components so as to reduce the 1/f noise included in the low-frequency components.

Furthermore, the FET band amplifier of the present invention comprises a multistage amplifier including amplifiers of multiple stages cascaded in which FETs are used as amplification elements, and a gain control circuit that controls a gain of the multistage amplifier. The amplifier of each stage has a high-band component elimination unit for eliminating components of bands higher than the upper limit of amplification band components from input/output signals. P channel FETs are used as FETs of at least first to nth-stage amplifiers. And the FET band amplifier has the feed back circuit for feeding back the components lower-frequency than the lower limit of amplification band component included in the output signal of the amplifier in the final stage to the first-stage amplifier in a reversed phase. As only the low-frequency components included in the output signal of the final-stage amplifier are fed back to the input side of the first-stage amplifier in the reversed phase and the low-frequency components are thereby cancelled, it is possible to eliminate the 1/f noise included in the low-frequency components. Furthermore, by using the p channel FET having a small mobility as an amplification element, the 1/f noise occurring in the amplifier can be further reduced.

In particular, it is desirable that the above-mentioned high-frequency component elimination unit be a low-pass filter in which the cutoff frequency is set at a value higher than the upper limit of the amplification band. It is possible, by providing the low-pass filter on the output side of the amplifier in each stage, to easily eliminate the thermal noise higher than the cutoff frequency of the low-pass filter.

It is also desirable to use a parasitic capacitance of an FET included in the amplifier in the next stage as a capacitor included in the low-pass filter. It is possible, by utilizing the parasitic capacitance of the FET instead of the capacitor as a stand-alone component, to reduce the number of components and thereby reduce the cost. Particularly, a parasitic capacitance occurs in the FET formed on a semiconductor substrate and therefore, by taking advantage of this, spaces on the semiconductor substrate can be used effectively and tips can be downsized compared to the case where a single capacitor is used to fabricate a low-pass filter.

Furthermore, the FET band amplifier of the present invention comprises a multistage amplifier including amplifiers of multiple stages cascaded in which FETs are used as amplification elements, and a gain control circuit that controls a gain of the multistage amplifier. P-channel FETS are used as the amplification elements included in the amplifiers at least up to mth stage. It is possible, by using the p-channel FETs having a small mobility, to suppress the occurring the 1/f noise, thus make it possible to reduce the residual noise included in a signal output from the last stage amplifier.

It is also desirable to use n-channel FETS as the amplification elements included in the amplifiers from an m+1-th stage onward. It is possible, by using the n-channel FETs as the amplification elements included in the amplifiers in the subsequent stages which do not contribute so much to prevention of saturation of the amplifiers, to render the space of component parts smaller compared to the case of entirely using the p-channel FETS.

It is also desirable to set a channel length L and a channel width W of the FETs included in the amplifiers up to the m-th stage at values larger than the channel length L and the channel width W of the FETs included in the amplifiers from the m+1-th stage onward. It is possible, by setting at large values only the channel length L and the channel width W of the FETs included in the amplifiers in the foregoing stages which significantly contribute to the prevention of saturation of the amplifiers, to render the space of component parts smaller compared to the case of rendering these values larger for all the FETs.

It is also desirable, when attention is paid to the FETs included in the plurality of amplifiers connected in the multiple stages as the amplification elements, to set the channel length L and the channel width W of the FETs included in the amplifiers placed in the foregoing stages at values larger than the channel length L and the channel width W of the FETs included in the amplifiers placed in the subsequent stages thereto. It is generally known that the 1/f noise generated in the FETs increases in proportion to the respective reciprocals of the channel length L and the channel width W. Therefore, it is possible, by setting the channel length L and the channel width W large, to reduce the 1/f noise generated in the FETS. In particular, when considering the FETs connected in the multiple stages, the 1/f noise generated in the FETs included in the foregoing stages is amplified in the FETs in the subsequent stages thereto so that it is desirable to reduce the 1/f noise generated in the FETs included in the foregoing stages for the sake of reducing overall low-frequency noise. Moreover, the 1/f noise generated in the FETs included in the subsequent stages is amplified to a lesser degree in the FETs in the more subsequent stages so that it supposedly contributes less to reduction in the overall low-frequency noise. Therefore, it is possible, by setting the channel length L and the channel width W in the FETs included in the subsequent stages at values smaller than those of the FETs in the preceding stages, to reduce the space occupied by the FETs so as to reduce the costs by miniaturizing the chips.

It is also desirable, when attention is paid to the FETs included in the plurality of amplifiers connected in the multiple stages as the amplification elements, to set the channel length L and the channel width W of each FET so that the noise component generated by the FET becomes smaller than that included in an input signal of the FET. It is possible, by rendering the noise component generated by any of the FETs smaller than that included in the input signal of the FET, to reduce the overall low-frequency noise.

It is also desirable to have the component parts integrally formed on a semiconductor substrate by using a CMOS process or a MOS process. It is possible, by using these processes, to simplify the process compared to the cases of using a bipolar process and so on so as to allow the component costs and the product costs including the FET band amplifier to be reduced.

It is also desirable that the above-mentioned semiconductor substrate have an N-well formed thereon and all or a part of the component parts be formed on the N-well. It is possible, by forming all or a part of the component parts on the N-well, to prevent a noise current from running via a pn joint surface formed between the N-well and the semiconductor substrate under it so as to prevent the noise generated in the circuit on the N-well from running round to another component through the semiconductor substrate.

It is also desirable that the above-mentioned semiconductor substrate have a guard ring formed around the component parts. It is thereby possible to further effectively prevent the noise generated in the circuit formed on the N-well from running round to another component through the semiconductor substrate.

It is also desirable to have the above-mentioned guard ring formed from a semiconductor substrate surface down to a position deeper than the N-well. It is possible, by forming the guard ring to the deep position, to eliminate the 1/f noise in a low-frequency area running round beyond the guard ring.

DETAILED DESCRIPTION OF THE PREFERRED EMBODIMENTS

Hereafter, an FET band amplifier according to an embodiment to which the present invention is applied will be described in detail.

[First Embodiment]

Figure 1:
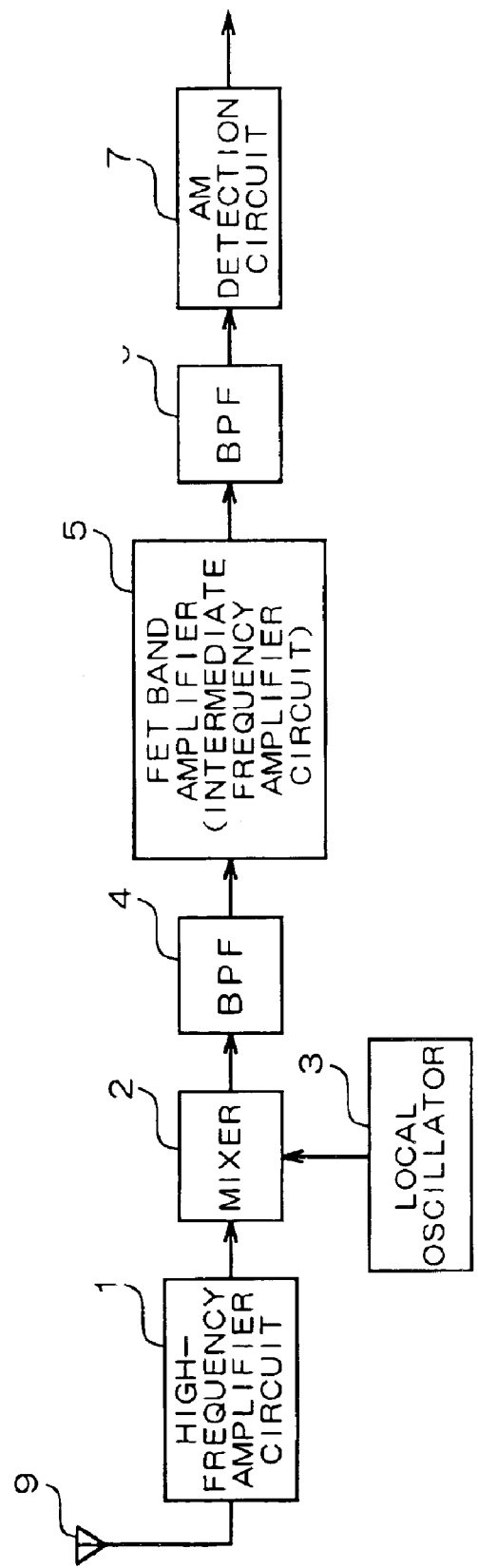
FIG. 1 is a diagram showing a general configuration of an AM receiver including the FET band amplifier according to a first embodiment.

FIG. 1 is a diagram showing a general configuration of an AM receiver including the FET band amplifier according to a first embodiment. As shown in FIG. 1, the AM receiver has a high-frequency amplifier circuit 1, a mixer 2, a local oscillator 3, BPF (Band-pass Filter) 4 and BPF 6, an FET band amplifier 5, an AM detection circuit 7. An AM wave received by an antenna 9 is amplified by the high-frequency amplifier circuit 1 and then a local oscillation signal outputted from the local oscillator 3 is mixed so as to perform a frequency conversion from a high-frequency signal to an intermediate frequency signal. For instance, if a frequency of a signal outputted from the high-frequency amplifier circuit 1 is f1 and the frequency of the local oscillation signal outputted from the local oscillator 3 is f2, a signal having the frequency of f1–f2 is outputted from the mixer 2.

The BPFs 4 and 6 are provided in foregoing and subsequent stages of the FET band amplifier 5 operating as an intermediate frequency amplification circuit, and extract only a frequency component in proximity to 455 kHz from an inputted intermediate frequency signal. The FET band amplifier 5 includes an AGC circuit (automatic gain control circuit), and amplifies a predetermined band component including an intermediate frequency signal with a gain controlled by the AGC circuit. The AM detection circuit 7 performs AM detection processing for the intermediate frequency signal amplified by the FET band amplifier 5.

Figure 2:
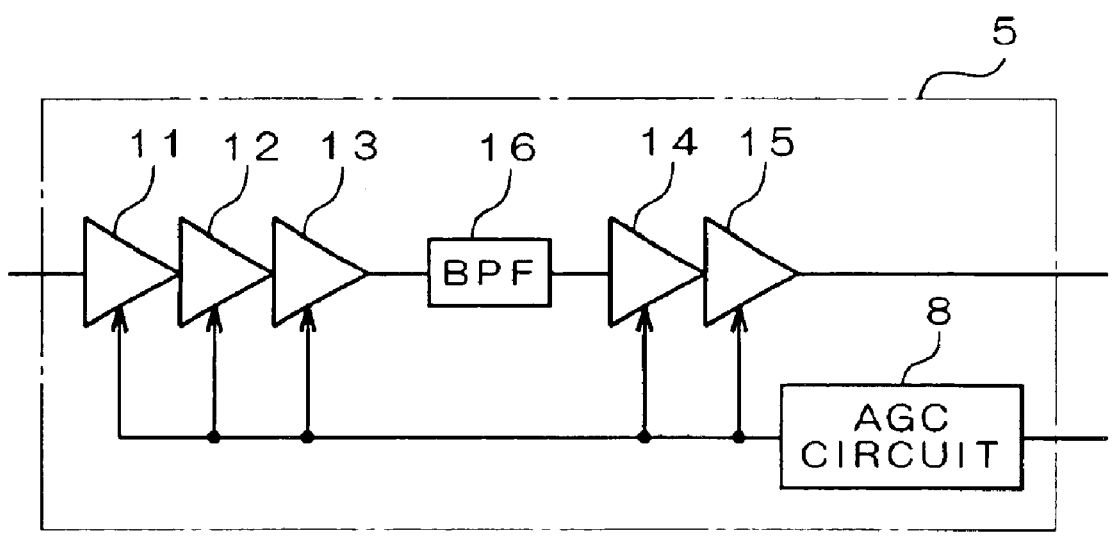
FIG. 2 is a diagram showing a configuration of the FET band amplifier according to the first embodiment.

FIG. 2 shows a configuration of the FET band amplifier 5 of this embodiment. As shown in FIG. 2, the FET band amplifier 5 of this embodiment comprises amplifiers of five stages 11 to 15 constituting a multistage amplifier, a BPF 16 inserted between a third-stage amplifier 13 and a fourth-stage amplifier 14, and an AGC circuit 8 that controls the gain based on an output signal of the AM detection circuit 7. Each of the amplifiers 11 to 15 has a predetermined gain, and the FET band amplifier 5 in its entirety has the gain wherein the gains of the amplifiers 11 to 15 are multiplied. The FET band amplifier 5 is integrally formed on a semiconductor substrate together with other circuits by using a CMOS process or a MOS process. It is thereby possible to simplify a manufacturing process so as to reduce the component costs or the product costs of the entire AM receiver.

Figure 3:
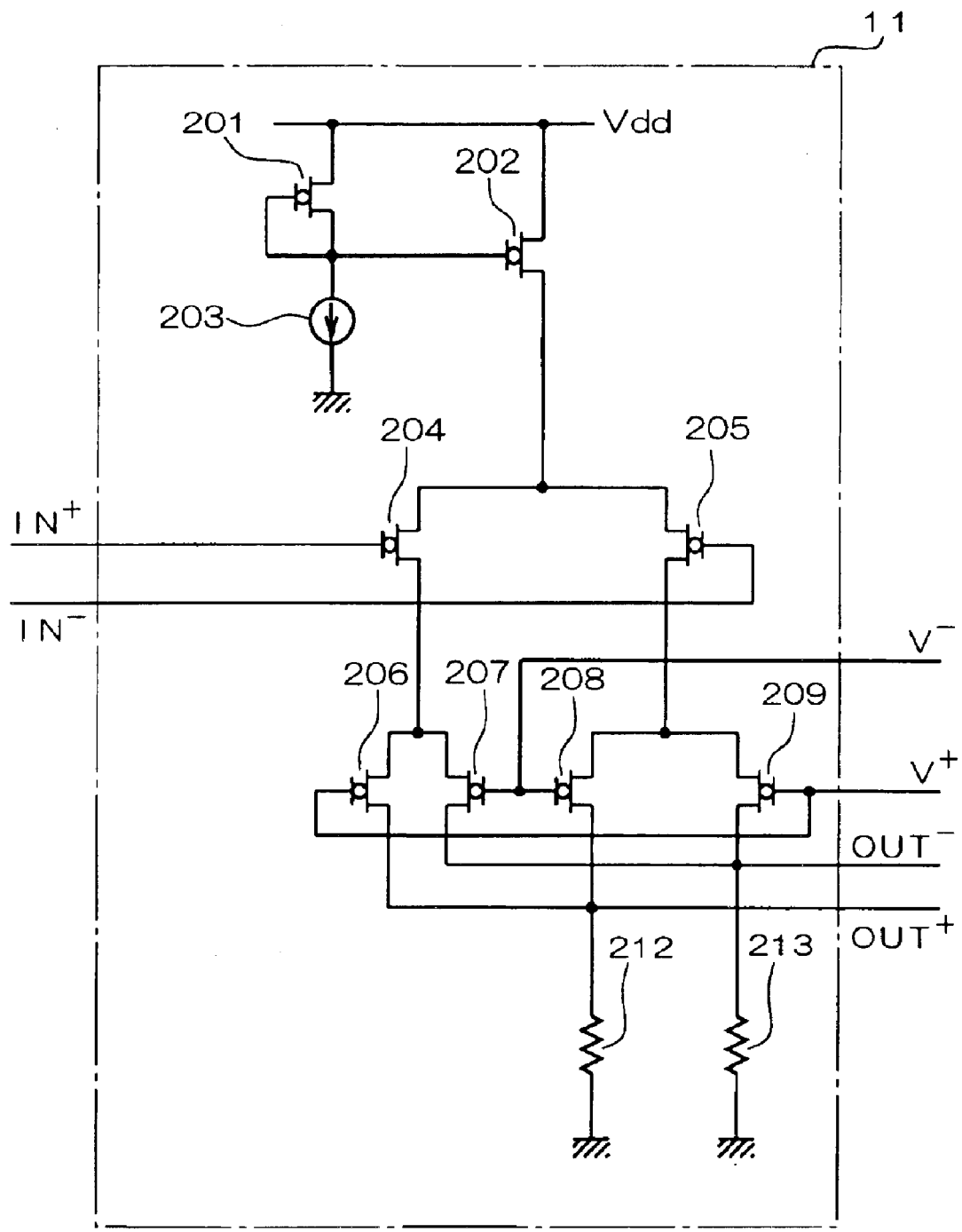
FIG. 3 is a circuit diagram showing a configuration of an amplifier included in the FET band amplifier shown in FIG. 2.

FIG. 3 is a circuit diagram showing a detailed configuration of an amplifier in each stage included in the FET band amplifier 5. The amplifiers 11 to 15 have the same configuration. Therefore, the configuration of the amplifier 11 will be described in detail hereafter.

As shown in FIG. 3, the amplifier 11 of this embodiment comprises FETs 201, 202 that generate constant currents, a current source 203, two FETs 204, 205 that differentially amplify input signals, four FETs 206, 207, 208, 209 that render variable the gains of differential outputs of these two FETs 204, 205 according to control signals $V^+$, $V^-$, and two load resistors 212, 213. Input signals ($IN^+$, $IN^-$) from a fore-stage circuit (BPF4) are inputted in the FETs 204, 205, and control signals ($V^+$, $V^-$) from the AGC circuit 8 are inputted in the FETs 206 to 209. The p-channel type is used for all the FETs 201, 202 and 206 to 209 included in this configuration.

Figure 4:
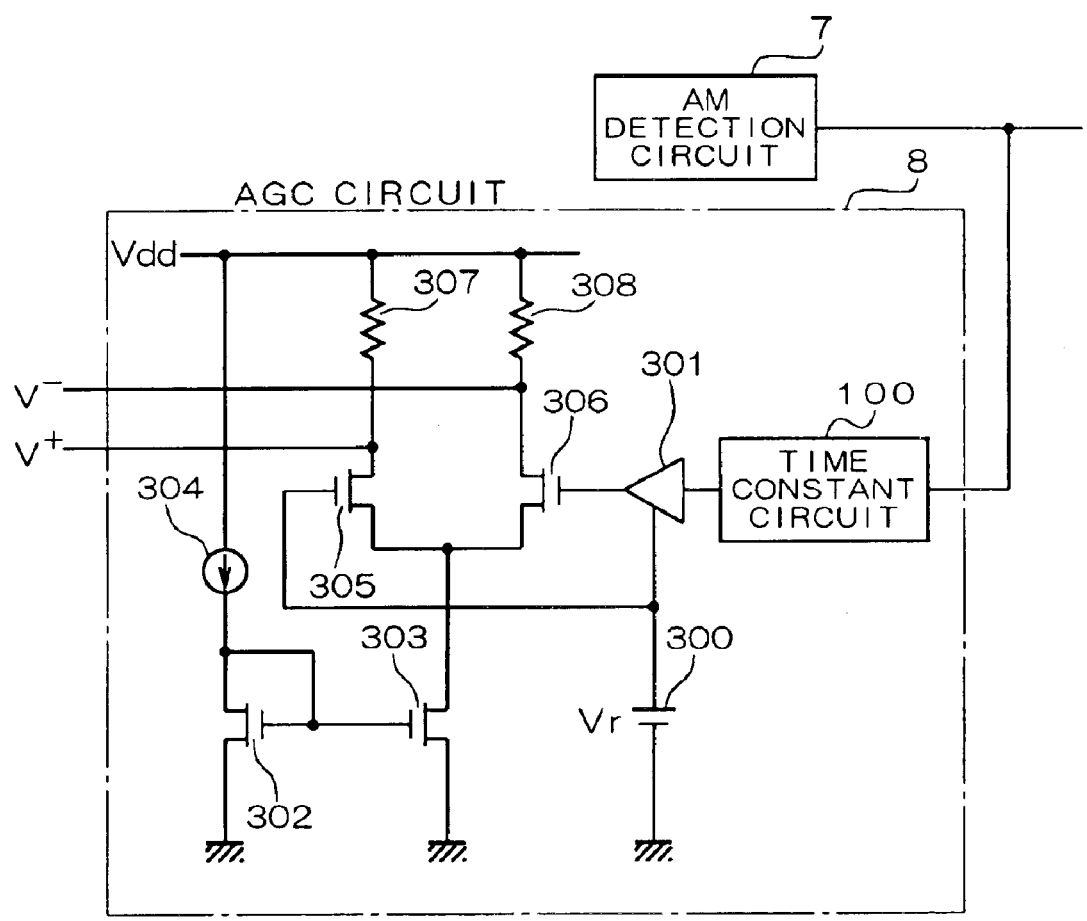
FIG. 4 is a circuit diagram showing a detailed configuration of an AGC circuit.

FIG. 4 is a circuit diagram showing a detailed configuration of the AGC circuit 8. As shown in FIG. 4, the AGC circuit 8 of this embodiment comprises a time constant circuit 100 that smoothes an input signal with a predetermined time constant, a power source 300 that produces a predetermined power supply voltage Vr, an amplifier 301 that amplifies an output voltage of the time constant circuit 100 using the power supply voltage Vr as an operating voltage, two FETs 302, 303 and a current source 304 that generate constant currents, two FETs 305, 306 and two resistors 307, 308 that differentially amplify the power supply voltage Vr produced in the power source 300 and the output voltage of the amplifier 301.

In the time constant circuit 100, the response time (time constant) when the output voltage increases and the response time when the output voltage decreases are set to different values in order to smooth the output signal of the AM detection circuit 7. For example, the response time when the voltage increases is set to 50 msec, and the response time when the voltage decreases is set to 300 to 500 msec. The amplifier 301 amplifies a smoothed output of the time constant circuit 100, and the output voltage varies within the range of 0V to the power supply voltage Vr.

That is, if the voltage level of the output signal of the AM detection circuit 7 is low, the output voltage of the time constant circuit 100 decreases, and therefore the output voltage of the amplifier 301 has a small value close to 0V. Thus, when focusing on two FETs 305, 306 performing a differential operation, the power supply voltage Vr is applied to the gate of one FET 305, a low voltage close to 0V is applied to the gate of the other FET 306, and two control signals ($V^+$, $V^-$) having a large potential difference are outputted from the drain of each FET. When the control signals are inputted in the amplifier 11 described above, the differential operation is performed by two FETs 206, 207 or two FETs 208, 209, and therefore the gain of the entire amplifier 11 is increased so that differential output signals ($OUT^+$, $OUT^-$) having a large potential difference are outputted from the amplifier 11.

Furthermore, if the voltage level of the output voltage of the AM detection circuit 7 is high, the output voltage of the time constant circuit 100 increases, and therefore the output voltage of the amplifier 301 has a value close to the power supply voltage Vr. Thus, when focusing on two FETs 305, 306 performing a differential operation, the power supply voltage Vr is applied to the gate of one FET 305, the power supply voltage Vr or a voltage close thereto is applied to the gate of the other FET 306, two control signals ($V^+$, $V^-$) of almost same voltage levels are outputted from the drain of each FET. When the control signals are inputted in the amplifier 11 described above, almost no differential operation is performed by two FETs 206, 207 or two FETs 208, 209, and therefore the gain of the entire amplifier 11 is decreased so that differential output signals ($OUT^+$, $OUT^-$) having a small potential difference are outputted from the amplifier 11.

Figure 5:
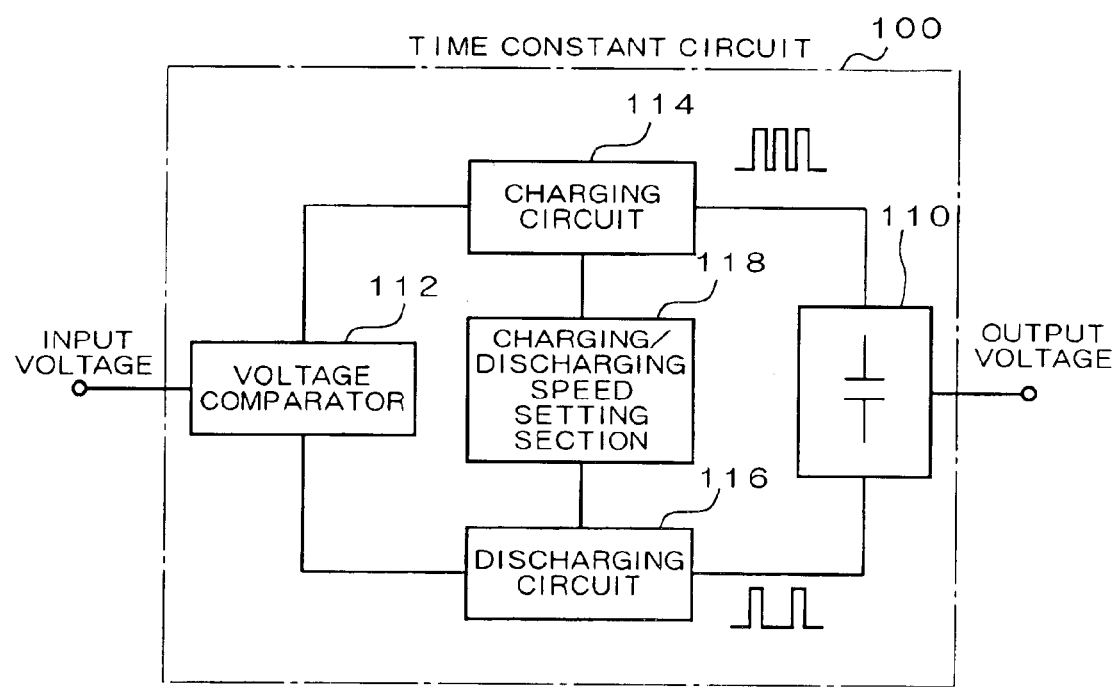
FIG. 5 is a block diagram showing a principle of a time constant circuit.

FIG. 5 shows a principle block of the time constant circuit 100. As shown in FIG. 5, the time constant circuit 100 of this embodiment comprises a capacitor 110, a voltage comparator 112, a charging circuit 114, a discharging circuit 116 and a charging/discharging speed setting section 118. The voltage comparator 112 compares the terminal voltage of the capacitor 110 with the input voltage, and enables the operation of the charging circuit 114 or the discharging circuit 116 depending on the result of the comparison. The charging circuit 114 intermittently supplies charging currents to charge the capacitor 110. For example, this charging circuit 114 comprises a constant current circuit and a switch, and a charging current is supplied from the constant current circuit to the capacitor 110 when the switch is turned on. Furthermore, the discharging circuit 116 has discharging currents passed therethrough intermittently to discharge the capacitor 110. For example, the discharging circuit 116 comprises a constant current circuit and a switch, and a constant current is discharged from the capacitor 110 when the switch is turned on. The charging/discharging speed setting section 118 makes a setting so that the charging speed of the capacitor 110 by the charging circuit 114 is different from the discharging speed of the capacitor 110 by the discharging circuit 116.

In this way, the time constant circuit 100 performs operations for charging and discharging the capacitor 110 intermittently. As a result, even if the electrostatic capacity of the capacitor 110 is reduced, voltages of both ends thereof gently change, thus making it possible to obtain charging/discharging characteristics almost equivalent to those that could be obtained if a circuit having a large time constant, namely a capacitor having a large electrostatic capacity, or a resistor having a large resistance value is used. Furthermore, in the charging circuit 114 and the discharging circuit 116, control is performed to supply a predetermined current to the capacitor 110 or discharge the current from the capacitor 110, but the supply and discharge operations are carried out intermittently, and therefore the current value at this time can be set to a relatively large value suitable for integration. Thus, an entire AGC circuit 8 including the time constant circuit 100 can be integrally formed on a semiconductor substrate to achieve integration. Furthermore, external parts such as a capacitor are not required, thus making it possible to considerably downsize the entire AGC circuit 8.

Furthermore, in the time constant circuit 100 of this embodiment, a setting is made so that the charging speed of the capacitor 110 is different from the discharging speed of the capacitor 110 by a charging/discharging speed setting section 118. Consequently, attack time and release time of the AGC circuit 8 can be made different.

Figure 6:
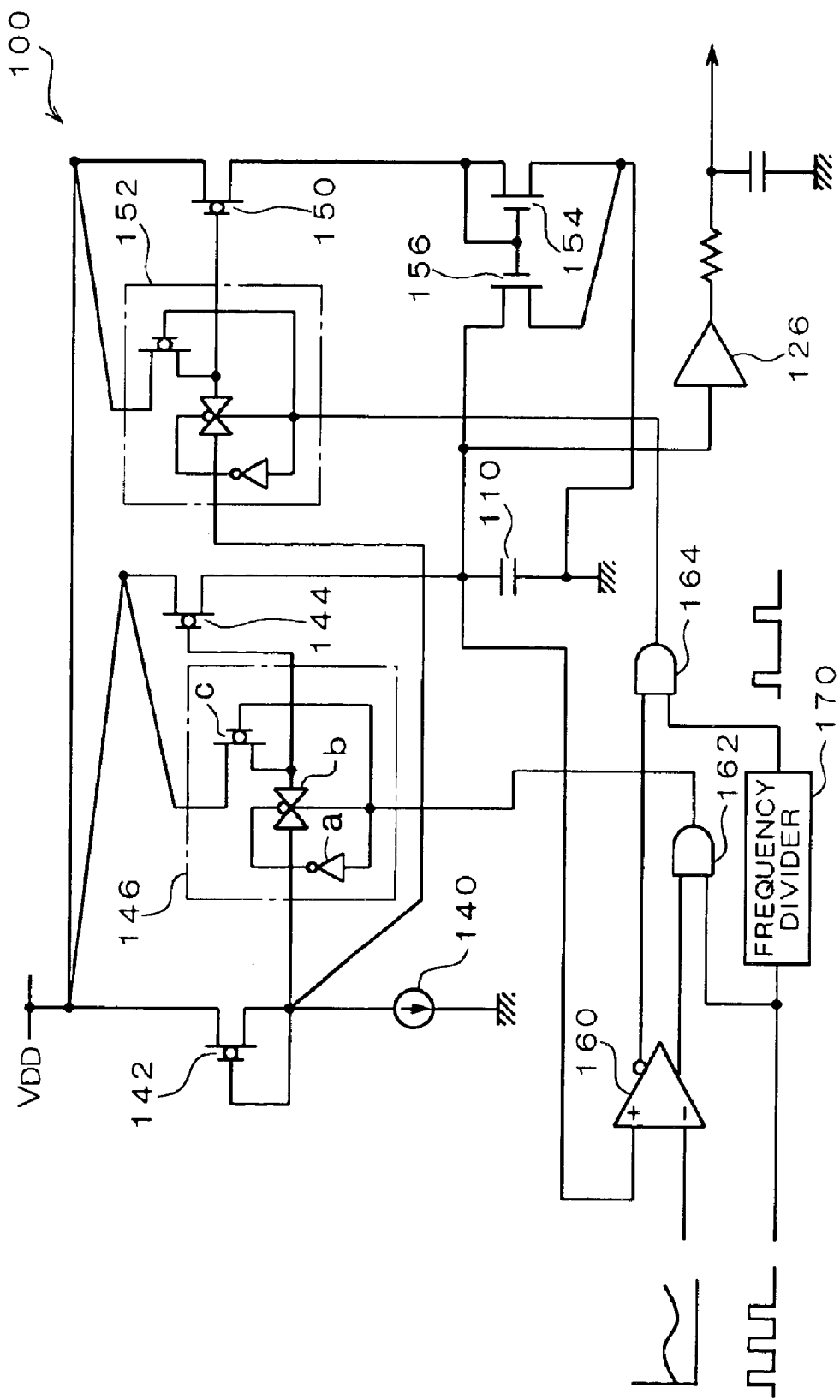
FIG. 6 is a circuit diagram showing a specific configuration of the time constant circuit.

FIG. 6 is a circuit diagram showing a specific configuration of the time constant circuit 100. As shown in FIG. 6, the time constant circuit 100 comprises the capacitor 110, a constant current circuit 140, FETs 142, 144, 150, 154 and 156, switches 146 and 152, a voltage comparator 160, AND circuits 162 and 164, and a frequency divider 170.

A current mirror circuit is constituted by two FETs 142, 144, and a charging current identical to the constant current outputted from a constant current circuit 140 is generated. Furthermore, the timing in which the charging current is generated is determined by a switch 146.

The switch 146 is constituted by an inverter circuit a, an analog switch b and an FET c. The analog switch b is constituted in such a manner that parallel connection is established between the source and the drain of each of the p-channel FET and the n-channel FET. An output signal of an AND circuit 162 is inputted directly to the gate of the n-channel FET, and a signal with the logic of the output signal inverted by the inverter circuit a is inputted in the gate of the p-channel FET. Thus, the analog switch b is on when the output signal of the AND circuit 162 is of high level and in contrast, the analog switch b is off when the AND circuit 162 is of low level. Furthermore, an FET c is intended for reliably stopping a current supply operation by the FET 144 by establishing connection in low resistance between the gate and the drain of the FET 144 when the analog switch b is off.

When the switch 146 is turned on, the gate of one FET 142 connected to the constant current circuit 140 is connected with the gate of the other FET 144, and therefore a current almost identical to the constant current generated by the constant current circuit 140 connected to one FET 142 is passed through the segment between the source and the drain of the other FET 144. This current is supplied to the capacitor 110 as a charging current. In contrast, when the switch 146 is turned off, the gate of the FET 144 is connected to the drain, and thus the supply of this charging current is stopped.

Furthermore, the current mirror circuit setting a discharging current of the capacitor 110 is constituted by combination of an FET 150 with the FET 142 and constant current circuit 140 described above, and the operation state thereof is determined by a switch 152. The switch 152 is identical in configuration to the switch 146. The on/off state of the switch 152 is controlled according to the logic of the output signal of an AND circuit 164. The switch 152 is on when the output signal is of high level and is off when the output signal is of low level.

When the switch 152 is turned on, the gate of one FET 142 connected to the constant current circuit 140 is connected with the gate of the other FET 150, and therefore a current almost identical to the constant current generated by the constant current circuit 140 is passed through the segment between the source and the drain of the other FET 150. This current serves as a discharging current for discharging accumulated electric charges on the capacitor 110.

However, because the current passing through the FET 150 cannot be taken out directly from the capacitor 110, another current mirror circuit constituted by the FETs 154, 156 is connected to the source side of the FET 150.

The gates of the two FETs 154, 156 are connected together, and when the above discharging current passes through the FET 154, the same current passes through the segment between the source and the drain of the other FET 156. The FET 156 has the drain connected to the terminal of the capacitor 110 on the high potential side, and the current passing through the FET 156 is generated with electric charges accumulated on the capacitor 110 being discharged.

Furthermore, a voltage comparator 160 compares the magnitude of terminal voltage of the capacitor 110 applied to the plus terminal with the magnitude of input voltage of the time constant circuit 100 applied to the minus terminal. The voltage comparator 160 has a non-inverting output terminal and an inverting output terminal, and if the terminal voltage of the capacitor 110 applied to the plus terminal is greater in magnitude than the input voltage applied to the minus terminal, a high-level signal is outputted from the non-inverting output terminal, and a low-level signal is outputted from the inverting output terminal. In contrast to this, if the terminal voltage of the capacitor 110 applied to the plus terminal is smaller in magnitude than the input voltage applied to the minus terminal, a low-level signal is outputted from the non-inverting output terminal, and a high-level signal is outputted from the inverting output terminal.

In an AND circuit 162, a predetermined pulse signal is inputted to one input terminal, and the non-inverting output terminal of the voltage comparator 160 is connected to the other input terminal. Thus, if the terminal voltage of the capacitor 110 is greater in magnitude than the input voltage of the time constant circuit 100, the predetermined pulse signal is outputted from the AND circuit 162.

Furthermore, in the AND circuit 164, a predetermined pulse signal outputted from a frequency divider 170 is inputted to one input terminal, and the inverting output terminal of the voltage comparator 160 is connected to the other input terminal. Thus, if the terminal voltage of the capacitor 110 is smaller in magnitude than the input voltage of the time constant circuit 100, the predetermined pulse signal is outputted from the AND circuit 164.

The frequency divider 170 frequency-divides a pulse signal inputted in one input terminal of the AND circuit 162 in a predetermined frequency dividing rate and outputs the same. As described above, the frequency-divided pulse signal is inputted to one input terminal of the AND circuit 164.

The time constant circuit 100 has the configuration described above, and operations thereof will now be described.

If the capacitor 110 is not charged at the time when the operation of the time constant circuit 100 is started, or the input voltage of the time constant circuit 100 (output voltage of AM detection circuit 7) is on the rise, the terminal voltage of the capacitor 110 is lower than the input voltage of the time constant circuit 100. At this time, a pulse signal is outputted from the AND circuit 162, while no pulse signal is outputted from the AND circuit 164. Thus, only the switch 146 is turned on intermittently, and a predetermined charging current is supplied to the capacitor 110 in synchronization with the switch 146 being turned on. This charging operation is continued until the terminal voltage of the capacitor 110 becomes relatively higher than the input voltage of the time constant circuit 100.

Furthermore, if the terminal voltage of the capacitor 110 exceeds the input voltage of the time constant circuit 100 due to the charging operation, or the input voltage drops and thus becomes lower than the terminal voltage of the capacitor 110, a pulse signal is outputted from the AND circuit 164, while no pulse signal is outputted from the AND circuit 162. Thus, only the switch 152 is turned on intermittently, and a predetermined discharging current is discharged from the capacitor 110 in synchronization with the switch 152 being turned on. This discharging operation is continued until the terminal voltage of the capacitor 110 becomes relatively lower than the input voltage of the time constant circuit 100.

Furthermore, when two types of pulse signals outputted from two AND circuits 162, 164 described above are compared, the duty ratio of pulse signals outputted from the AND circuit 162 is larger than the duty ratio of pulse signals outputted from the AND circuit 164 and therefore, if pulse signals are outputted from two AND circuits 162, 164 over the same duration, the charge speed per unit time is higher than the discharging speed. Consequently, the attack time of the AGC circuit 8 is shorter than the release time.

Furthermore, the frequency divider 170 is used for outputting pulse signals of different duty ratios from two AND circuits 162, 164 in the time constant circuit 100 described above, but pulse signals of different duty ratios may be separately generated and inputted to two AND circuits 162, 164, respectively.

Furthermore, the rates per unit time at which FETs 144 and 150 are turned on are made different for providing a difference between the charging speed and the discharging speed of the capacitor 110 in the time constant circuit 100 described above, but the charging current and the discharging current themselves may be made different by providing a difference between gates sizes of these FETs.

Figure 7:
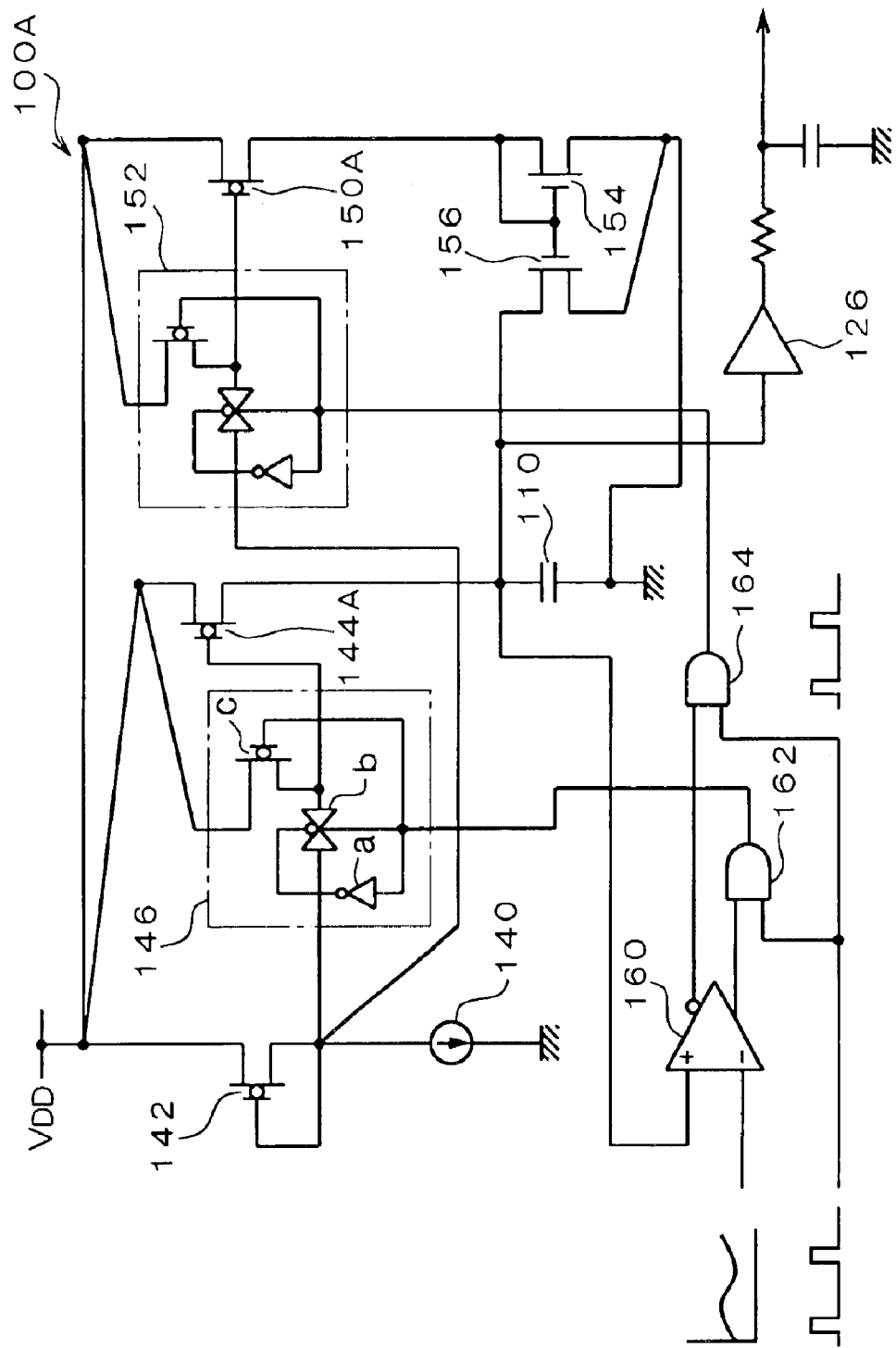
FIG. 7 is a circuit diagram showing a modified example of the time constant circuit.

FIG. 7 is a circuit diagram showing a modified example of a time constant circuit. A time constant circuit 100A shown in FIG. 7 is different from the time constant circuit 100 shown in FIG. 6 in that the frequency divider 170 is eliminated, and two FETs 144, 150 are change d to two FETS 144A, 150A different in gate size from the FETs 144, 150, respectively.

Figure 8:
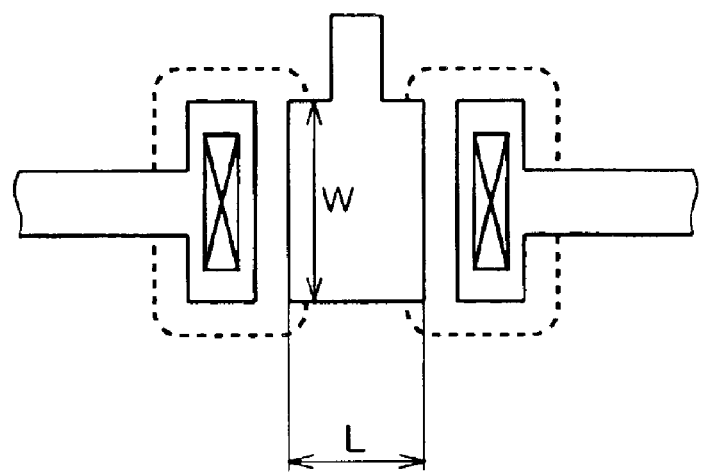
FIG. 8 is a diagram showing a gate size of a MOS-type FET.

FIG. 8 shows the gate size of a MOS-type FET. Even if the gate voltage is unchanged, the channel resistance is changed by changing the gate width W and the gate length L, and therefore the current passing through between the source and the drain is changed. In this embodiment, in order that the amount of charging current is increased and attack time is reduced, the gate width W of the FET 144A is set to a large value, and the gate length L of the FET 144A is set to a small value. On the other hand, in order that the amount of discharging current is reduced and release time is increased, the gate width W of the FET 150A is set to a small value, and the gate length L of the FET 150A is set to a large value. In this way, by providing a difference between the gates sizes of the FETs 144A and 150A, the attack time and the release time of the AGC circuit 8 can be made difference easily.

In this way, the amplifier 11 or the like included in the FET band amplifier 5 of this embodiment has two FETs 204, 205 performing a differential operation, and is controlled to have a gain $A_1$ by four FETs 206 to 209 and the AGC circuit 8. Similarly, where the gains of other amplifiers 12 to 15 are $A_2, A_3, A_4$ and $A_5$, respectively, a gain of $A_1 A_2 A_3 A_4 A_5$ can be achieved theoretically for the entire FET band amplifier 5.

In each of amplifiers 11 to 15, a 1/f noise and a thermal noise occur. The 1/f noise is the noise appearing in a low-frequency area of the signal, and the lower the frequency becomes, the higher a noise level becomes. Inversely, the thermal noise is the noise appearing in a high-frequency area of the signal, and the higher the frequency becomes, the higher the noise level becomes. A noise voltage $v_n$ generated by the MOS-type FETs can be represented as follows.

$$v_n = \sqrt{((8kT(1+\eta)/(3g_m) + KF/(2fC_{ox}WLK'))\Delta f)} \quad (1)$$

Here, k is a Boltzmann's constant, T is an absolute temperature, $g_m$ is a mutual conductance, Cox is a capacity between the gate and channel sandwiching a gate oxide film, W is a gate width, L is a gate length, f is a frequency and $\Delta f$ is a bandwidth of the frequency f. KF is a noise parameter which is a value between $10^{-20}$ and $10^{-25}$ or so. η and K' are predetermined parameters.

In this formula, the first term on the right side indicates the thermal noise, and it apparently becomes larger in proportion as a temperature (T) rises. The second term on the right side indicates the 1/f noise, and it is apparently in proportion to the reciprocal of f.

If the noise (total of the 1/f noise and thermal noise) generated in each of the amplifiers 11 to 15 is $e_{n1}$, $e_{n2}$, $e_{n3}$, $e_{n4}$ and $e_{n5}$, the noise levels $e_1$, $e_2$, $e_3$, $e_4$ and $e_5$ included in each of the output signals of the amplifiers 11 to 15 are as follows.

$$e_1 = e_{n1} \quad (2)$$

$$e_2 = e_1 A_2 + e_{n2} = e_{n1} A_2 + e_{n2}$$

$$e_3 = e_2 A_3 + e_{n3} = (e_{n1} A_2 + e_{n2}) A_3 + e_{n3}$$

$$e_4 = e_3 A_4 + e_{n4} = ((e_{n1} A_2 + e_{n2}) A_3 + e_{n3}) A_4 + e_{n4}$$

$$e_5 = e_4 A_5 + e_{n5} = (((e_{n1} A_2 + e_{n2}) A_3 + e_{n3}) A_4 + e_{n4}) A_5 + e_{n5}$$

Thus, signals inputted/outputted between amplifiers 11 and 15 each include a 1/f noise mainly existing in a low frequency area and a thermal noise mainly existing in a high frequency area, and the level of noise is amplified and a larger amount of noise is accumulated in the amplifier closer to the rearmost amplifier. Accordingly, even if the gain is controlled to have a small value by the AGC circuit 8, the noise becomes xtremely large before it is outputted from the amplifier 15 of the final stage, and is inputted to subsequent circuits as a large residual noise if the level of noise occurring in amplifiers of the fore-stage part (e.g. first and second-stage amplifiers 11 and 12) is high.

For avoiding this problem, the BPF 16 is used in the FET band amplifier 5 of this embodiment. The BPF 16 is intended for allowing components of the amplification band (components included in a signal that are to be amplified) to pass through and removing the 1/f noise and the thermal noise described above. In the case of the AM receiver according to this embodiment shown in FIG. 1, it is sufficient if the FET band amplifier 5 can amplify only the band of the intermediate frequency signal in proximity to 455 kHz. Therefore, as for a characteristic of the BPF 16, it is necessary to set the lower cutoff frequency (kHz) at a value equal to or lower than 455—α (2α is the band of the intermediate frequency signal) and capable of sufficiently eliminating the 1/f noise and also set the upper cutoff frequency at a value equal to or higher than 455+α and capable of sufficiently eliminating the thermal noise.

Furthermore, the noise occurring in amplifiers of the fore-stage part should be removed by the BPF 16 in this embodiment. Therefore, the BPF 16 is inserted between the third-stage amplifier 13 and the fourth-stage amplifier 14.

In this way, noise components occurring in the amplifiers 11, 12, 13 connected before the BPF 16 can be removed by the BPF 16 to reduce a residual noise included in a signal outputted from the amplifier 15 of the final stage.

Furthermore, in the case where the gain of each amplifier 11 to 15 is set to a low level by the AGC circuit 8, the noise included in the signal outputted from the amplifier 15 of the final stage can be effectively removed by providing the BPF 16 at a location close to the amplifier 15, but in the case where the gain of each amplifier 11 to 15 is set to a high level by the AGC circuit 8, it can be considered that the noise increases to cause the amplifier to be saturated in amplifiers of stages before the final-stage amplifier 15, and therefore the BPF 16 should be placed at a location such that the saturation is prevented.

In this way, in the FET band amplifier 5 of this embodiment, the BPF 16 is inserted between the third-stage amplifier 13 and the fourth-stage amplifier 14 so that the 1/f noise and the thermal noise amplified before the BPF 16 are removed, thus making it possible to reduce a residual noise included in the signal outputted from the final-stage amplifier 15. Consequently, even if the gain of the FET band amplifier 5 is set to a sufficiently small value by AGC circuit 8, the level of offensive residual noise included in the output audio of a receiver can be reduced.

Furthermore, by using the p-channel FET having a small mobility as an FET included as an amplification element in each amplifier 11 to 15, a noise occurring in each amplifier can be further reduced, thus making it possible to further reduce a residual noise produced by the FET band amplifier 5.

Particularly, the MOS-type FET has a large amount of 1/f noise compared to the bipolar transistor, and therefore if amplifiers are connected in multiple stages to form the FET band amplifier 5, the 1/f noise may be increased and thus an extremely large amount of residual noise occurs unless noise-countermeasures are taken. Therefore, if the CMOS process or MOS process is used to form integrally all the parts including the FET band amplifier 5 or other circuits on a semiconductor substrate, it is effective to take noise countermeasures using the BPF 16 or using the p-channel FET in forming the FET band amplifier 5 or other circuits integrally on the semiconductor substrate to achieve integration.

Furthermore, the p-channel FET is used for all amplifiers 11 to 15 in this embodiment, but the p-channel FET may be used for amplifiers of first to nth (e.g. second stage) stages having a significant effect in reduction of a noise. In this way, accumulated noise components can be efficiently reduced.

[Second Embodiment]

One BPF is inserted after the third-stage amplifier 13 to remove noise components in the first embodiment described above, but noise components may be removed in the amplifier of each stage.

Figure 9:
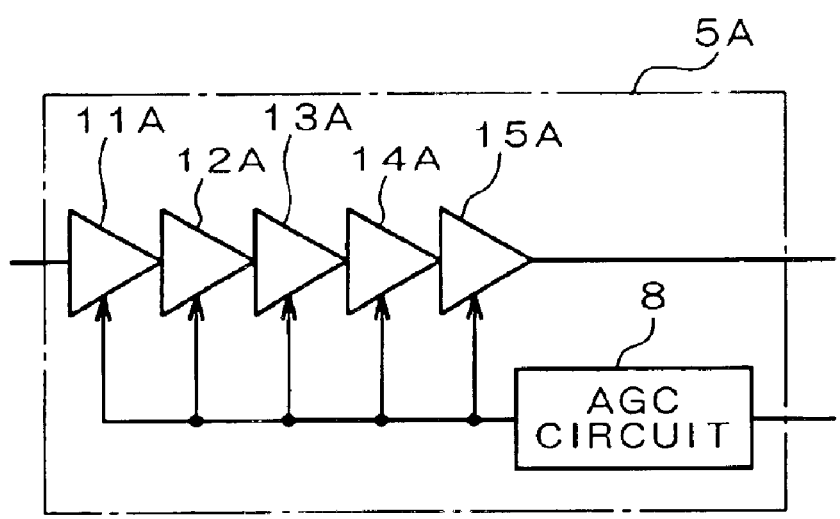
FIG. 9 is a circuit diagram showing a configuration of the FET band amplifier according to a second embodiment.

FIG. 9 is a circuit diagram showing a configuration of an FET band amplifier according to a second embodiment. An FET band amplifier 5A of this embodiment shown in FIG. 9 comprises amplifiers 11A, 12A, . . . , 15A of five stages cascaded to constitute a multistage amplifier, and an AGC circuit 8. As the configurations of the amplifiers 11A to 15A are basically the same, the detailed configuration and operation will be described hereafter by paying attention to the first-stage amplifier 11A.

Figure 10:
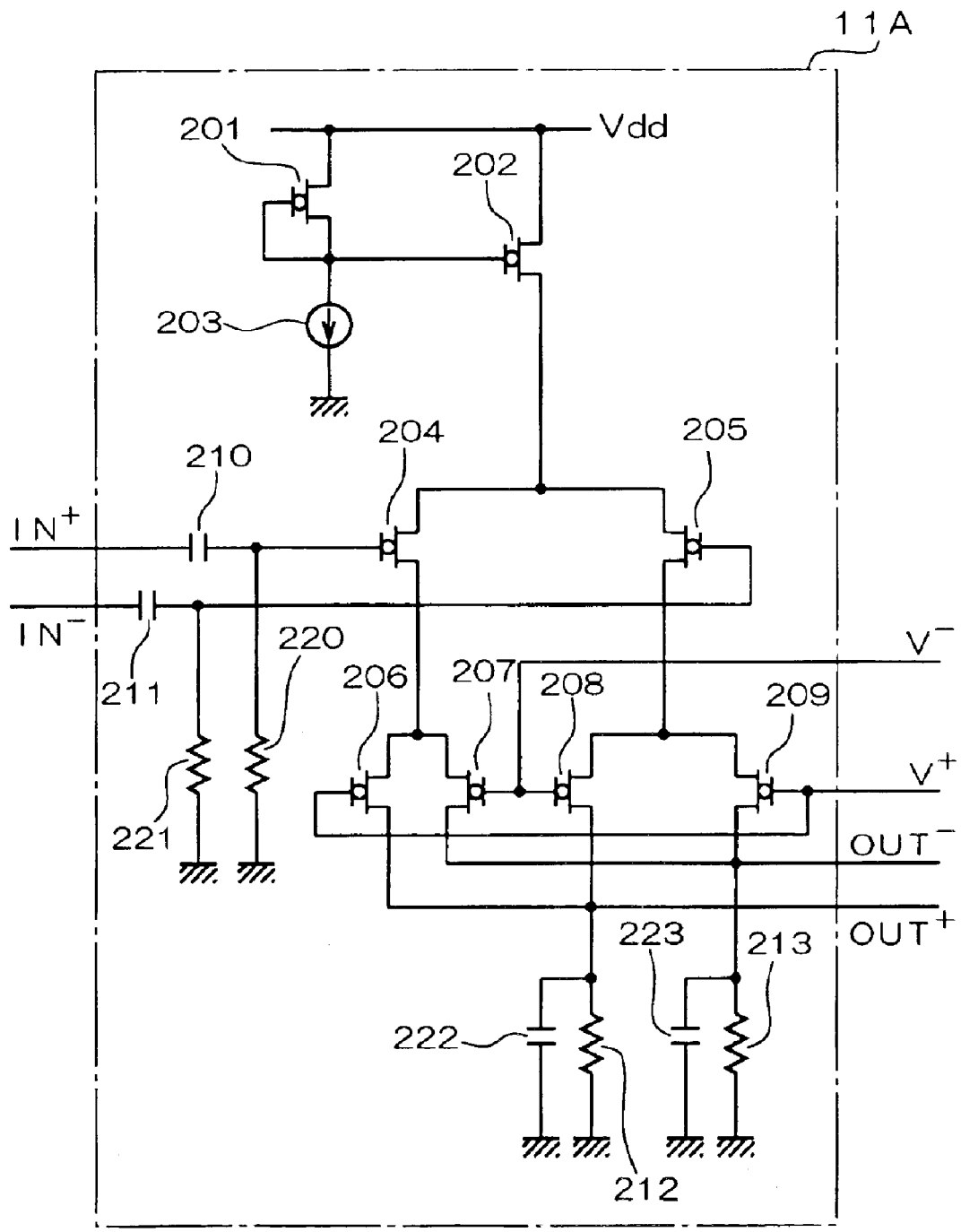
FIG. 10 is a diagram showing a configuration of an amplifier included in the FET band amplifier shown in FIG. 9.

FIG. 10 is a diagram showing a configuration of an amplifier included in the FET band amplifier shown in FIG. 9. As shown in FIG. 10, the amplifier 11A of this embodiment comprises FETs 201, 202 and a current source 203 that generate constant currents, two FETs 204, 205 differentially amplifying input signals, four FETs 206, 207, 208, 209 rendering variable the gains of differential outputs of th se two FETs 204, 205 according to control signals V⁺, V⁻, two capacitors 210, 211 removing direct current components from input signals and two load resistors 212, 213. Input signals (IN⁺, IN⁻) from a fore-stage circuit (BPF4) are inputted in the FETS 204, 205, and control signals (V⁺, V⁻) from an AGC circuit 8 are inputted in the FETs 206 to 209. The p-channel type is used for all the FETs 201, 202 and 206 to 209 included in this configuration. Furthermore, resistors 220, 221 connected to one ends of the capacitors 210, 211, respectively, constitute a highpass filter with these capacitors 210, 211, and remove low-band components including flicker noises (1/f noises) from input signals. The resistors 220, 221 and the capacitors 210, 211 correspond to a low-band component elimination unit. Furthermore, capacitors 222, 223 connected in parallel to the resistors 212, 213, respectively, constitute a low-pass filter with these resistors 212, 213, and remove high-band components including thermal noises from output signals. The resistors 212, 213 and the capacitors 222, 223 correspond to a high-band component elimination unit.

In this way, in the first-stage amplifier 11A, the 1/f noise included in the low-band component of the inputted signal is removed, and the thermal noise included in the high-band component of the outputted signal is removed.

Incidentally, the above-mentioned amplifier 11A has the capacitors 222, 223 connected in parallel to the resistors 212, 213 respectively. However, it is also possible to insert the capacitors 222, 223 between the drain and a fixed potential other than the ground of each of the FETs 206, 207.

As for the capacitors 222, 223, it is also possible to utilize a parasitic capacitance of the FETs included in the amplifier 11A.

Figure 11:
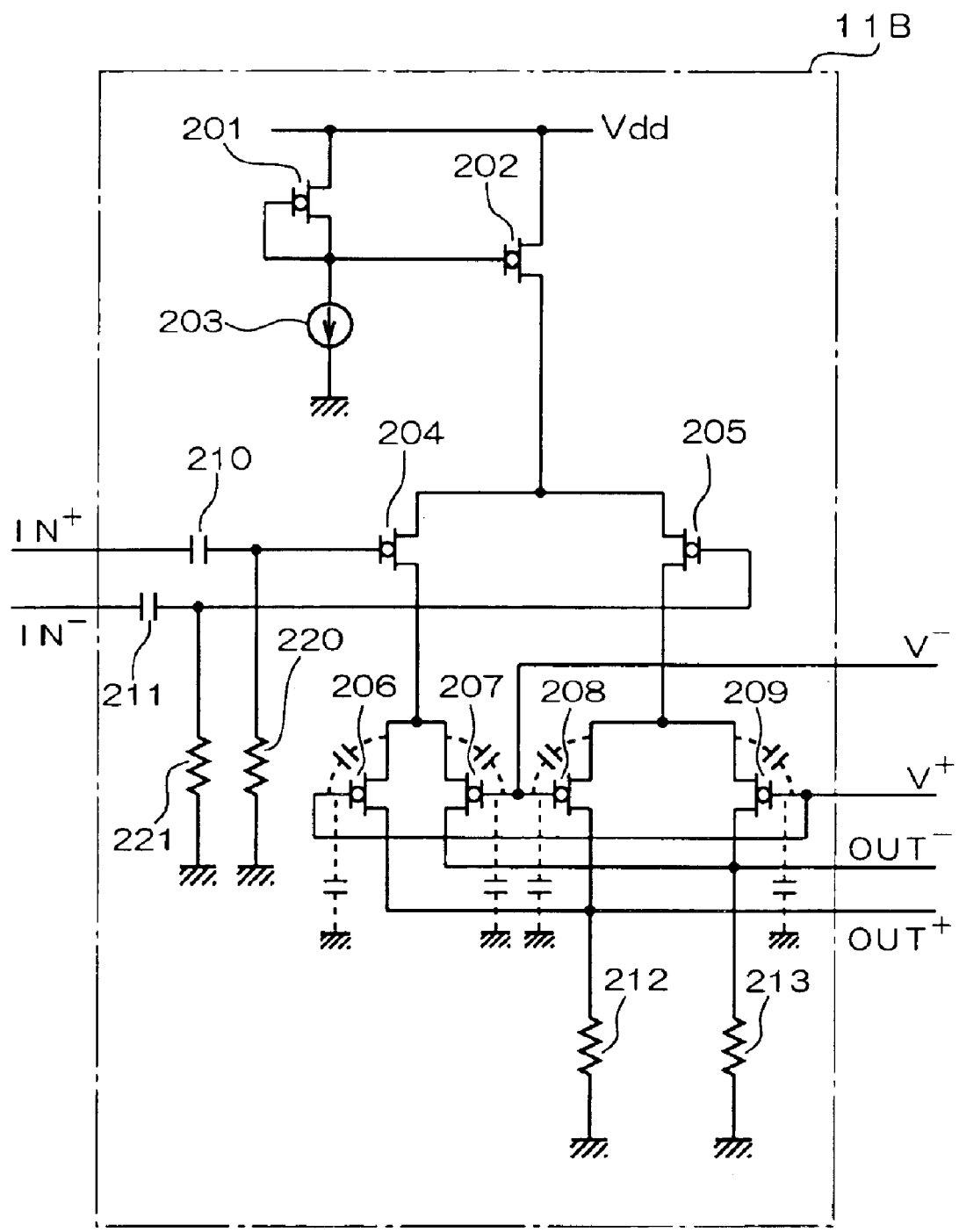
FIG. 11 is a circuit diagram showing a configuration of the amplifier having the number of capacitors reduced by utilizing parasitic capacitance of FETs.

FIG. 11 is a circuit diagram showing the configuration of the amplifier having the number of the capacitors reduced by utilizing the parasitic capacitance of the FETs. Compared to the configuration of the amplifier 11A shown in FIG. 10, it is different in that the capacitors 222, 223 are omitted and that gate length L and gate width W of the FETs 206 to 209 are set larger in the amplifier 11B shown in FIG. 11.

It is generally known that a noise current generated by the FET is in proportion to the reciprocal of the gate length L. Therefore, it is possible to reduce the noise current by setting the gate length L longer. However, a channel resistance increases if the gate length L becomes longer, and so it is desirable to set the gate width W wider correspondingly to reduce the channel resistance. Thus, if the gate length L and gate width W are set larger in order to reduce the noise current, the area of a gate electrode becomes larger and the parasitic capacitance also becomes larger. Therefore, it becomes possible to secure a capacity value of a certain level so that the parasitic capacitance can be used instead of the capacitors 222, 223.

Thus, it is possible, by increasing both the gate length L and gate width W and thereby increasing the parasitic capacitance and then omitting the capacitors 222, 223, to eliminate the high frequency components of the signals, that is, the thermal noise, more effectively, not to mention that the costs can be reduced by omitting the capacitors 222, 223.

[Third Embodiment]

Figure 12:
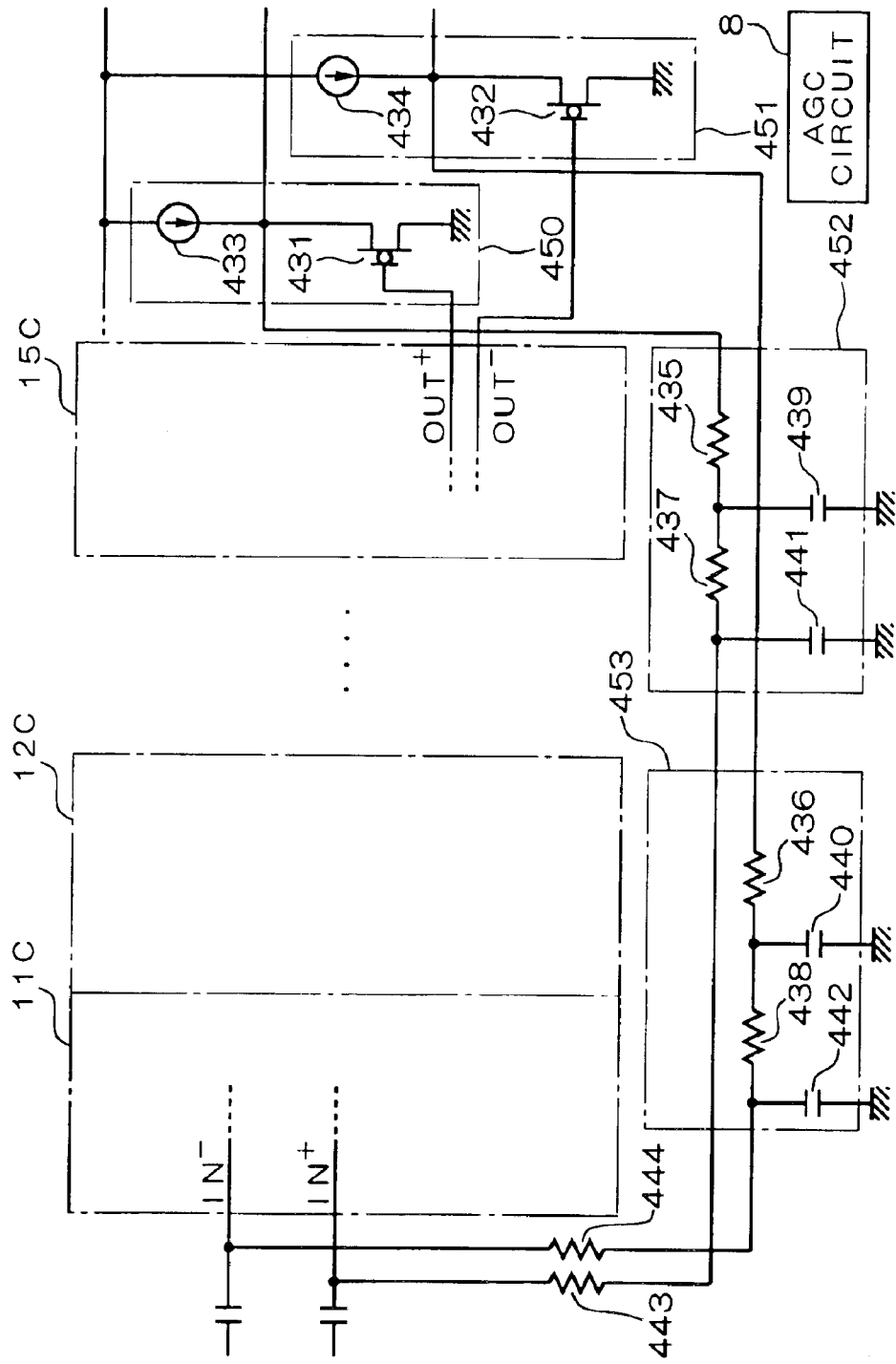
FIG. 12 is a circuit diagram showing a configuration of the FET band amplifier according to a third embodiment.

FIG. 12 is a circuit diagram showing a configuration of an FET band amplifier according to a third embodiment.

An FET band amplifier of this embodiment shown in FIG. 12 includes amplifiers 11C, 12C, . . . , 15C of five stages cascaded to constitute a multistage amplifier, an addition circuit taking out to the outside a signal outputted from the final-stage amplifier 15C and returning the signal back to the first-stage amplifier 11C, and an AGC circuit 8. The amplifiers 11C to 15C are identical in configuration.

Figure 13:
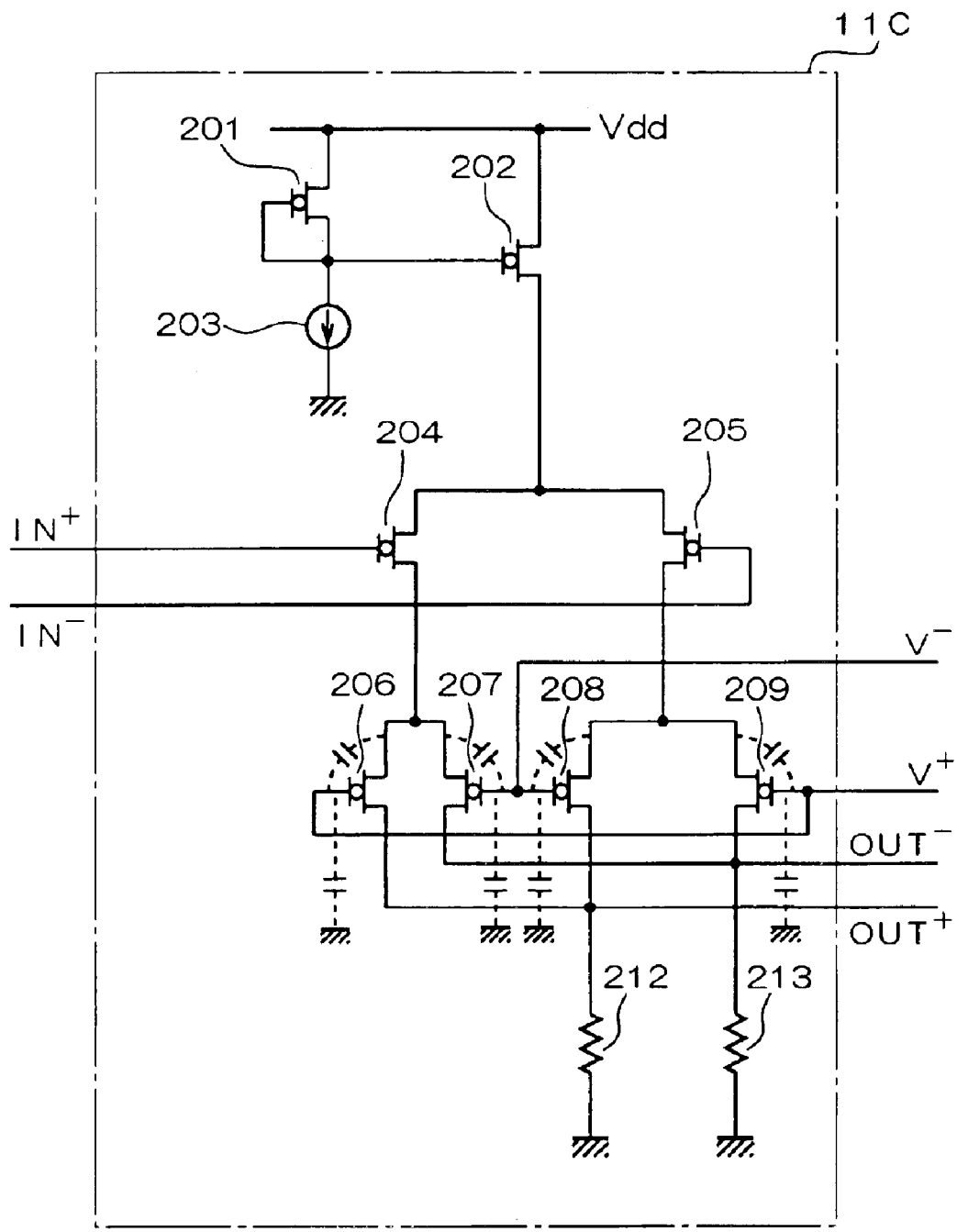
FIG. 13 is a diagram showing a configuration of an amplifier included in the FET band amplifier shown in FIG. 12.

FIG. 13 is a diagram showing a detailed configuration of the amplifier 11C. The amplifier 11C has a configuration in which the resistors 220, 221 and the capacitors 210, 211 are absent compared to the configuration shown in FIG. 11.

In addition, the additional circuit provided to the FET band amplifier according to this embodiment includes a source follower circuit 450 comprised of an FET 431 and a constant circuit 433, a source follower circuit 451 comprised of an FET 432 and a constant circuit 434, an LPF 452 comprised of resistors 435, 437 and capacitors 439, 441 and an LPF 453 comprised of resistors 436, 438 and capacitors 440, 442.

One differential output signal outputted from the final-stage amplifier 15C is taken out as one output signal of the FET band amplifier via the source follower circuit 450, and is fed back to one input terminal of the first-stage amplifier 11C via the LPF 452 and a resistor 443. Likewise, the other differential output signal outputted from the final-stage amplifier 15C is taken out as the other output signal of the FET band amplifier via the source follower circuit 451, and is fed back to the other input terminal of the first-stage amplifier 11C via the LPF 453 and a resistor 444.

Incidentally, the FET band amplifier according to this embodiment includes the amplifiers in five stages (odd number) 11C to 15C, the phase of the signal outputted from the final-stage amplifier 15C is reversed to that of the signal inputted to the first-stage amplifier 11C. Therefore, extracting only the low-frequency component of the signal outputted from the source follower circuits 450, 451 with the LPFs 452, 453 and feeding it back to the first-stage amplifier 11C is nothing but to eliminate only this low-frequency component by reducing the gain corresponding to this component. To be more specific, by forming a feedback loop shown in FIG. 12, a low-frequency component elimination unit is formed, and thereby it is possible to effectively eliminate the 1/f noise included in the low-frequency component.

Thus, it is also possible to effectively eliminate the 1/f noise by forming the feedback loop in the entire FET band amplifier and feeding back only the low-frequency component of the output signal to the input side of the first-stage amplifier 11C. In addition, it is possible, by eliminating the high-frequency components in the each stage of the amplifiers 11C to 15C, to effectively eliminate the thermal noise included in the high-frequency components.

The amplifier 11C according to this embodiment shown in FIG. 13 eliminates the high-frequency component of the signal by utilizing the parasitic capacitance of the FET. However, it is also possible to use the capacitor as in the above-mentioned second embodiment shown in FIG. 10. In this case the capacitor should be connected in parallel to the resistors 213, 214 in FIG. 13.

[Fourth Embodiment]

The above-mentioned embodiments have the FET band amplifier constituted by providing the BPF and so on for eliminating the noise components included outside the band in use to the middle or each stage of the plurality of amplifiers connected in multiple stages. However, it is also possible to take countermeasures against the noise in the amplifier in each stage without providing the BPF and so on.

Figure 14:
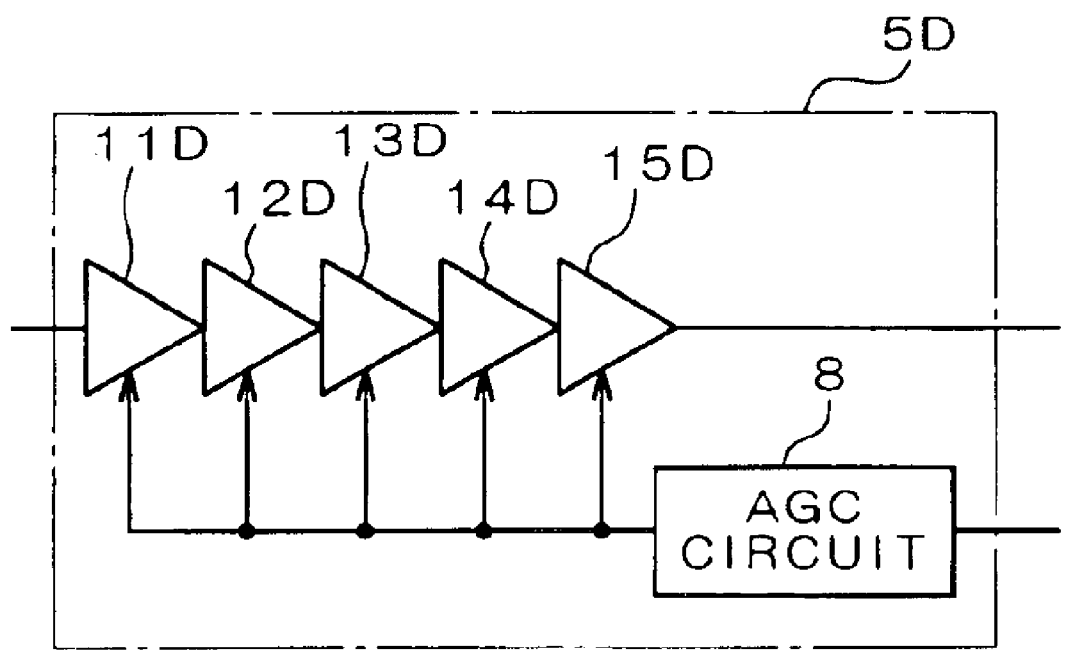
FIG. 14 is a diagram showing a configuration of the FET band amplifier according to a fourth embodiment.

FIG. 14 is a diagram showing a configuration of an FET band amplifier 5D according to this embodiment. An FET band amplifier 5D shown in FIG. 14 comprises a plurality of amplifiers 11D to 15D cascaded to constitute a multistage amplifier, and an AGC circuit 8. The FET band amplifier 5D is integrally formed on a semiconductor substrate together with other circuits using the CMOS process or MOS process.

The above-mentioned plurality of amplifiers 11D to 15D have the countermeasures against the noise taken for the first to n-th stages. For instance, as for the countermeasures against the noise, a technique of using the p-channel MOS FETs and a technique of increasing the gate width W and gate length L are used independently or in combination.

As described above, it is possible to reduce the 1/f noise appearing in the low-frequency area by using the p-channel MOS FETs, which is the technique especially effective when integrally forming the FET band amplifier on the semiconductor substrate.

As described above, the second term on the right side of the formula (1) indicates the 1/f noise and the gate width W and gate length L are in a denominator therein. Therefore, it is shown that the 1/f noise can also be reduced by setting the gate width W and gate length L at large values. In addition, if the gate width W and gate length L are set large, the parasitic capacitance of the FET also becomes large so that it also becomes effective for the sake of eliminating the thermal noise appearing in a high-frequency area.

As described above, by taking noise-countermeasures in the amplifiers of first to nth stages, noise components amplified by amplifiers of rear stages and accumulated can be reduced, thus making it possible to effectively reduce a residual noise included in a signal outputted from the final-stage amplifier 15D.

Incidentally, if the noise (total of the 1/f noise and thermal noise) g negated in each of the amplifiers 11D to 15D is $en_{n1}$, $e_{n2}$, $e_{n3}$, $e_{n4}$ and $e_{n5}$, and the gain of each of the amplifiers 12D to 15D is $A_2$, $A_3$, $A_4$ and $A_5$, the noise levels $e_1$, $e_2$, $e_3$, $e_4$ and $e_5$ included in each of the output signals of the amplifiers 11D to 15D are as shown in formula (2) mentioned above.

While the noise becomes the least by taking the countermeasures against the noise as to all the amplifiers 11D to 15D, the element area becomes larger compared to the case of using the n-channel FETs if all the FETs are the p-channel FETS. It is also the same in the case of increasing the gate width W and gate length L, and the element area becomes larger if this countermeasures against the noise are taken. In particular, in the case of integrally forming the FET band amplifier on the semiconductor substrate, it is desirable to attempt a higher density and reduced costs due to reduction in the occupied space and take the above-mentioned countermeasures against the noise in the first to n-th stages in order to effectively prevent saturation of the amplifiers due to the reduction in the noise.

To be more precise, in the case where a noise level $e_m$ included in the output signal of the m-th stage amplifier is sufficiently larger (a few times larger, for instance) than the noise level occurring when taking no countermeasure against the noise as to the m+1-th stage amplifier, a sufficient effect cannot be expected even if the countermeasures against the noise are taken as to the amplifiers from the m+1-th stage onward, it is sufficient to take the above-mentioned countermeasure against the noise as to the amplifiers up to the m-th stage. It thereby becomes possible to obtain the effects of reducing the chip area and preventing the saturation with the noise in the case of integrally forming the FET band amplifier on the semiconductor substrate.

Incidentally, it is also possible to perform the following as to up to what stage the gate width W and gate length L of the FETs included in the amplifiers therein should b larger than those of the FETs included in the amplifiers thereafter.

Considering the case of connecting the amplifiers in multiple stages, the 1/f noise generated by the FETs included in the amplifiers in the foregoing stage is amplified by the FETs included in the amplifiers in the subsequent stages thereto. Therefore, it is desirable to reduce the 1/f noise generated by the FETs included in the amplifiers in the foregoing stage for the sake of reducing the overall low-frequency noise. On the other hand, the 1/f noise generated by the FETs included in the amplifier in the subsequent stage is amplified to a lesser extent by the FETs included in the amplifiers in the more subsequent stages thereto, and so it supposedly contributes less to the reduction in the overall low-frequency noise. Therefore, it is possible, by setting the channel length L and the channel width W in the FETs included in the amplifiers in the subsequent stages at values smaller than those of the FETs in the preceding stages, to reduce the space occupied by the FETs so as to reduce the costs by miniaturizing the chips.

It is also possible, when attention is paid to the FETs included in the amplifiers in an arbitrary position shown in FIG. 14, to set the channel length L and the channel width W of the FET included in each amplifier so that the noise component generated by the FET becomes smaller than that included in the input signal of the FET. It is possible, by rendering the noise component generated by any of the FETs included in any of the amplifiers smaller than that included in the input signal of the FET, to reduce the overall low-frequency noise.

It is also possible to apply the technique of using the p-channel MOS FETs to constitute the amplifiers up to m-th stage and using the n-channel MOS FETs to constitute the amplifiers from m+1-th stage onward to the FET band amplifier according to the above-mentioned first to third embodiments. It is also possible, in this case, to obtain the effects of reducing the chip area and preventing the saturation due to the reduction in the noise.

[Fifth Embodiment]

In the case of integrally forming the FET band amplifier and the other circuits on the semiconductor substrate in the above-mentioned embodiments, the amplifier in each stage using the p-channel FETs as the amplification elements is formed on the N-well so as to prevent the noise from running round to another circuit through the semiconductor substrate.

Figure 15:
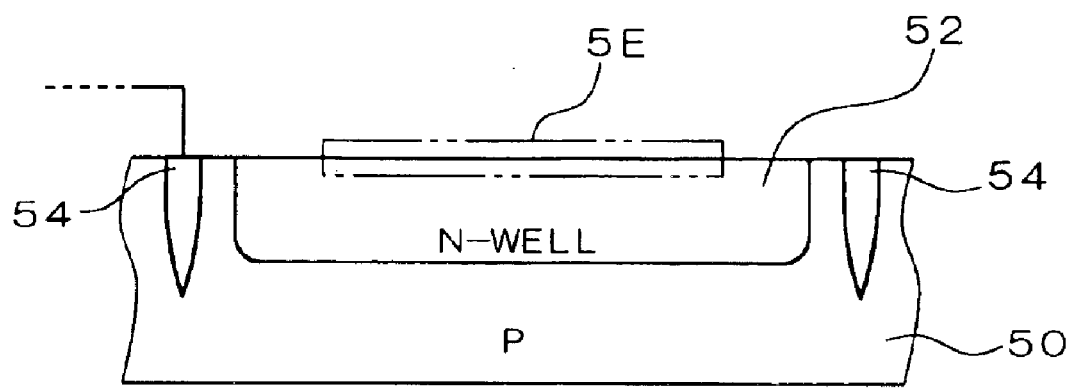
FIG. 15 is a diagram showing an outline configuration of the FET band amplifier according to a fifth embodiment.
Figure 16:
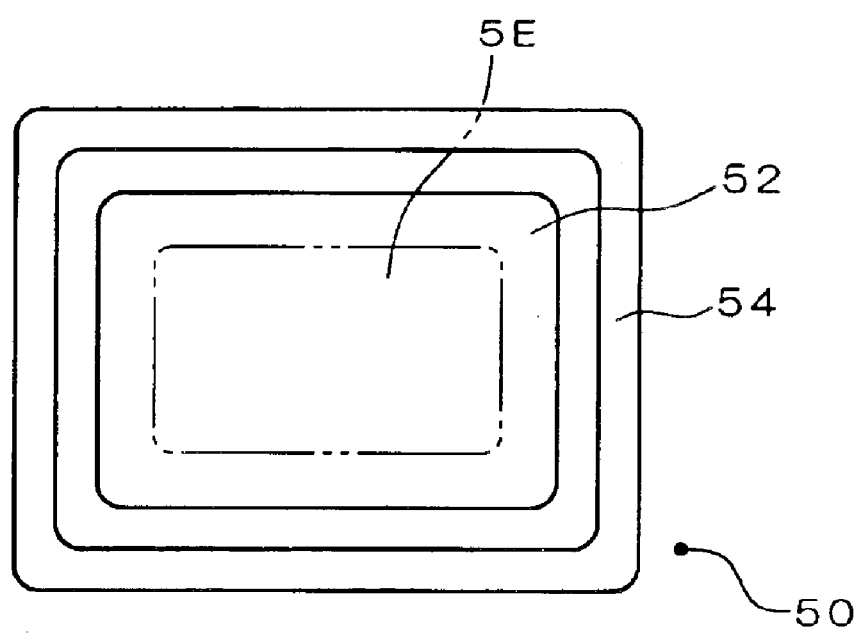
FIG. 16 is a sectional view of the configuration shown in FIG. 15.

FIG. 15 is a plane view showing an outline configuration of an FET band amplifier 5E according to a fifth embodiment. FIG. 16 is a sectional view of the configuration shown in FIG. 15. As for the configuration in FIG. 15, in the case where the amplifier in each stage is constituted by using the p-channel FETS, all the components of the FET band amplifier 5E are formed on an N-well 52. In the case where the amplifier in each stage up to the m-th stage is constituted by using the p-channel FETs, all the components of each amplifier up to the m-th stage are formed on the N-well 52.

As a PN joint surface is formed between the N-well 52 and a P-type semiconductor substrate 50, the current running from the N-well 52 to the semiconductor substrate 50 is interrupted on the PN joint surface in the case where the potential of the N-well 52 is higher than that of the semiconductor substrate 50. For this reason, it is possible to prevent the noise generated in the circuit formed on the N-well 52 from running round to another circuit through the semiconductor substrate 50.

In particular, it is possible, by forming the amplifiers in the stages up to the m-th stage on the N-well 52, to prevent the noise generated in the amplifiers in the stages up to the m-th stage from running round to the amplifiers in the stages from the m+1-th onward through the semiconductor substrate 50 so as to reduce the noise level amplified and accumulated in the stages from the m+1-th onward in the FET band amplifier.

As shown in FIG. 16, a guard ring 54 is formed in an area surrounding the N-well 52 and the proximity of the surface of the semiconductor substrate 50. The guard ring 54 is a portion of a P-type semiconductor substrate 50 formed in an N-type area. As a PNP layer is formed by the guard ring 54 and the semiconductor substrate 50, it is possible to effectively prevent the noise generated in the circuit formed on the N-well 52 from running round to another circuit through the proximity of the surface of the semiconductor substrate 50.

In particular, it is desirable to form the guard ring 54 so as to reach a deeper layer area of the semiconductor substrate 50, that is, a point deeper than the N-well 52 for instance. Thus, in the case where the noise generated in the circuit formed on the N-well 52 runs round to another circuit through the downside (inside of the semiconductor substrate 50) of the guard ring 54, it becomes possible to prevent a lower-frequency component from running round. Therefore, it is possible, by forming the amplifiers in the stages up to the m-th stage on the N-well 52, to prevent the 1/f noise generated in the amplifiers in the stages up to the m-th stage from running round to the amplifiers in the stages from the m+1-th onward through the downside of the guard ring 54 so as to reduce the noise level amplified and accumulated in the stages from the m+1-th onward in the FET band amplifier.

The present invention is not limited to the above embodiments, but a variety of modified implementations are possible within the gist of the present invention. For instance, according to the above-mentioned embodiments, the FET band amplifier is constituted by the amplifiers cascaded in five stages, where the number of the stages may be changed as appropriate according to the level at which the gain of the entire FET band amplifier is to be set.

The FET band amplifier 5 and the like that are used for intermediate frequency amplifiers of AM receivers are described in the embodiments described above, but the present invention may be applied for FET band amplifiers for use in other receivers such as FM receivers and direct conversion receivers and apparatuses other than receivers.

Industrial Applicability

As described above, according to the present invention, it is possible, by using the band-pass filter having a passing band wider than the amplification band, to eliminate the 1/f noise existing on a lower-frequency side than the passing band and the thermal noise existing on a higher-frequency side than that. Furthermore, a noise occurring in an amplifier can be further reduced by using as an amplification element a p-channel FET having a small mobility. Thus, by removing a noise occurring in each amplifier of the fore-stage part by a band-pass filter, and reducing the occurring noise itself by using the p-channel FET as an amplification element, a residual noise included in a signal outputted from the final-stage amplifier during gain control can be considerably reduced. Furthermore, by using an FET as an amplification element, an entire FET band amplifier can be fabricated on a semiconductor substrate in a process for producing FETs, thus making it possible to make an integration process easier and achieve a reduction of costs and savings in space, compared to the case where a bipolar transistor is used as an amplification element.

What is claimed is:

1. An FET band amplifier, comprising a multistage amplifier and a gain control circuit that controls a gain of the multistage amplifier,
    wherein said multistage amplifier comprises amplifiers of multiple stages cascaded in which FETs are used as amplification elements, and a band-pass filter inserted in mid-stage of the amplifiers of multiple stages and adjusted to have a passing band wider than an amplification band, and
    p-channel FETS are used as said FETS of at least first to nth-stage amplifiers of said amplifiers,
    wherein component parts are integrally formed on a semiconductor substrate by using a CMOS process or a MOS process.

2. The FET band amplifier according to claim 1, wherein said p-channel FETs are used as all amplification elements included in said amplifiers.

3. The FET band amplifier according to claim 1, wherein said semiconductor substrate has an N-well formed thereon and all or a part of said component parts are formed on the N-well.

4. The FET band amplifier according to claim 3, wherein said semiconductor substrate has a guard ring formed around said component parts.

5. The FET band amplifier according to claim 4, wherein said guard ring is formed from said semiconductor substrate's surface down to a position deeper than said N-well.

6. An FET band amplifier, comprising a multistage amplifier that comprises amplifiers of multiple stages cascaded in which FETs are used as amplification elements, and a gain control circuit that controls a gain of the multistage amplifier,
    wherein said amplifier of each stage has a high-band component elimination unit for eliminating components of bands higher than the upper limit of amplification band components from input/output signals and a low-band component elimination unit for eliminating components of bands lower than the lower limit of said amplification band components from said input/output signals, and
    p-channel FETs are used as said FETs of at least first to nth-stage amplifiers of said amplifiers,
    wherein component parts are integrally formed on a semiconductor substrate by using a CMOS process or a MOS process.

7. The FET band amplifier according to claim 6, wherein said low-frequency component elimination unit is a high-pass filter in which a cutoff frequency is set at a value lower than said lower limit.

8. The FET band amplifier according to claim 6, wherein said amplifiers are differential amplifiers for differentially operating said two FETs, and said low-frequency component elimination unit is a feedback circuit for inputting in phase to said two FETs a signal in which low-frequency components of differential output signals of said amplifier in each stage are synthesized.

9. The FET band amplifier according to claim 6, wherein said high-frequency component elimination unit is a low-pass filter in which a cutoff frequency is set at a value higher than said upper limit.

10. The FET band amplifier according to claim 9, wherein a parasitic capacitance of said FET included in said amplifier in the next stage is used as a capacitor included in said low-pass filter.

11. The FET band amplifier according to claim 6, wherein said p-channel FETs are used as all amplification elements included in said amplifiers.

12. The FET band amplifier according to claim 6, wherein said semiconductor substrate has an N-well formed thereon and all or a part of said component parts are formed on the N-well.

13. The FET band amplifier according to claim 12, wherein said semiconductor substrate has a guard ring formed around said component parts.

14. The FET band amplifier according to claim 13, wherein said guard ring is formed from said semiconductor substrate's surface down to a position deeper than said N-well.

15. An FET band amplifier, comprising a multistage amplifier that comprises amplifiers of multiple stages cascaded in which FETs are used as amplification elements, and a gain control circuit that controls a gain of the multistage amplifier,
  wherein said amplifier of each stage has a high-band component elimination unit for eliminating components of bands higher than the upper limit of amplification band components from input/output signals,
  p-channel FETs are used as said FETs of at least first to nth-stage amplifiers of said amplifiers, and
  the FET band amplifier comprises a feedback circuit returning back components of bands lower than the lower limit of said amplification band components included in an output signal of the final-stage amplifier of said amplifiers to the first-stage amplifier of said amplifiers in the state of an inverted phase.

16. The FET band amplifier according to claim 15, wherein said high-frequency component elimination unit is a low-pass filter in which a cutoff frequency is set at a value higher than said upper limit.

17. The FET band amplifier according to claim 16, wherein a parasitic capacitance of said FET included in said amplifier in the next stage is used as a capacitor included in said low-pass filter.

18. The FET band amplifier according to claim 15, wherein said p-channel FETs are used as all amplification elements included in said amplifiers.

19. The FET band amplifier according to claim 15, wherein component parts are integrally formed on a semiconductor substrate by using a CMOS process or a MOS process.

20. The FET band amplifier according to claim 19, wherein said semiconductor substrate has an N-well formed thereon and all or a part of said component parts are formed on the N-well.

21. The FET band amplifier according to claim 20, wherein said semiconductor substrate has a guard ring formed around said component parts.

22. The FET band amplifier according to claim 21, wherein said guard ring is formed from said semiconductor substrate's surface down to a position deeper than said N-well.

23. An FET band amplifier, comprising a multistage amplifier that comprises amplifiers of multiple stages cascaded in which FETs are used as amplification elements, and a gain control circuit that controls a gain of the multistage amplifier,
  wherein p-channel FETs are used as the amplification elements included in first to mth-stage amplifiers of said amplifiers,
  wherein n-channel FETs are used as the amplification elements included in said amplifiers in the stages from an m+1-th stage onward.

24. The FET band amplifier according to claim 23, wherein a channel length L and a channel width W of said FETs included in said amplifiers in the stages up to m-th stage are set at values larger than the channel length L and the channel width W of said FETs included in said amplifiers in the stages from the m+1-th stage onward.

25. The FET band amplifier according to claim 23, wherein, when attention is paid to said FETs included in said plurality of amplifiers connected in multiple stages as said amplification elements, the channel length L and the channel width W of said FETs included in said amplifiers placed in the foregoing stages are set at values larger than the channel length L and the channel width W of said FETs included in said amplifiers placed in the subsequent stages thereto.

26. The FET band amplifier according to claim 23, wherein, when attention is paid to said FETs included in said plurality of amplifiers connected in multiple stages as said amplification elements, the channel length L and the channel width W of each of said FETs are set so that noise component generated by the FET becomes smaller than the noise component included in an input signal of the FET.

27. The FET band amplifier according to claim 23, wherein component parts are integrally formed on a semiconductor substrate by using a CMOS process or a MOS process.

28. The FET band amplifier according to claim 27, wherein said semiconductor substrate has an N-well formed thereon and all or a part of said component parts are formed on the N-well.

29. The FET band amplifier according to claim 28, wherein said semiconductor substrate has a guard ring formed around said component parts.

30. The FET band amplifier according to claim 29, wherein said guard ring is formed from said semiconductor substrate's surface down to a position deeper than said N-well.

* * * * *